US007092257B2

(12) United States Patent
Westerheide

(10) Patent No.: US 7,092,257 B2
(45) Date of Patent: Aug. 15, 2006

(54) BENDABLE LOW VOLTAGE CONTACT RAIL FOR TRACK LIGHTING SYSTEMS

(75) Inventor: Jurgen Westerheide, San Juan Capistrano, CA (US)

(73) Assignee: Bruck Lighting System, Inc., Costa Mesa, CA (US)

( * ) Notice: Subject to any disclaimer, the term of this patent is extended or adjusted under 35 U.S.C. 154(b) by 16 days.

(21) Appl. No.: 10/429,064

(22) Filed: May 2, 2003

(65) Prior Publication Data

US 2004/0218395 A1 Nov. 4, 2004

(51) Int. Cl.
*H05K 1/14* (2006.01)
*H05K 1/02* (2006.01)

(52) U.S. Cl. ....................... 361/784; 361/637; 361/639

(58) Field of Classification Search ................ 362/806, 362/84, 800, 551, 249, 391; 361/637–639; 439/492, 495; 313/511
See application file for complete search history.

(56) References Cited

U.S. PATENT DOCUMENTS 4,190,309 A 2/1980 Glass ....................... 339/21 R
4,626,742 A * 12/1986 Mental ....................... 313/503
4,827,081 A * 5/1989 Seabourne et al. ......... 174/139
5,154,509 A 10/1992 Wulfman et al. ........... 362/226
5,603,622 A 2/1997 Lin ............................ 439/121
5,672,003 A 9/1997 Shemitz et al. ............. 362/396
6,183,104 B1 * 2/2001 Ferrara ....................... 362/145
6,183,290 B1 * 2/2001 Loibl ......................... 439/492
6,352,355 B1 * 3/2002 Law ........................... 362/253
6,358,070 B1 3/2002 Lin ............................ 439/115
6,490,169 B1 * 12/2002 Watanabe ................... 361/784
6,634,765 B1 * 10/2003 Lin ............................ 362/249
6,700,393 B1 * 3/2004 Haag et al. ................. 324/674

* cited by examiner

*Primary Examiner*—Sandra O'Shea
*Assistant Examiner*—Anabel Ton
(74) *Attorney, Agent, or Firm*—Gene Scott, Patent Law & Venture

(57) ABSTRACT

A lighting track apparatus includes elongated colored tubes which are easily bent into stable curved shapes to custom shape and fit sections of the apparatus into a track lighting system. Plural elongated electrical conductors are mechanically flexible and able to support low voltage lighting currents without significant temperature rise. An elongated non-conducting mechanical support is highly flexible so as to accept the shape of the tubes when bent. It engages with the tubes and the electrical conductors, whereby, the apparatus is easily formed into a curved shape that retains a selected curvature. A lamp or other appliance can be mounted on the apparatus, electrically contacting the conductors for power. The mechanical support is transparent so that the tubes may be seen.

9 Claims, 1 Drawing Sheet

BENDABLE LOW VOLTAGE CONTACT RAIL FOR TRACK LIGHTING SYSTEMS

RELATED APPLICATIONS

This application claims priority and is entitled to the filing date of a German (DE) patent application having Ser. No. 202 09 862.1 and an official filing date of Jun. 26, 2002 and a title, translated from German, of: "Low Voltage Power Line. " The contents of the aforementioned application are incorporated by reference herein.

BACKGROUND OF THE INVENTION

Incorporation by Reference

Applicant(s) hereby incorporate herein by reference, any and all U.S. patents, U.S. patent applications, and other documents and printed matter cited or referred to in this application.

FIELD OF THE INVENTION

This invention relates generally to electrical lighting circuits and conductors and more particularly to a low voltage lighting track for attachment of lamps in random placement.

DESCRIPTION OF RELATED ART

Low voltage contact rail systems using two flexible conductors running side by side and separated and supported by an insulating material over their entire length are known in the art. These systems are assembled using adhesives, or cross-section interlocking. Such low voltage contact rail systems provide unlimited possibilities for positioning lamps or other electrical devices anywhere throughout the entire system length, however, such rails are not easy to form into curves without seriously distorting the insulation and thereby degrading the integrity of the assembled structure, or causing the appearance of the rail to become disfigured. When curved sections of rail are required it is a usual procedure to custom bend the various sections of the rail prior to assembly at the factory using special tools. This is an ungainly process of design, manufacture, installation, redesign or correction of tracks and so on. For this reason, although such systems are relatively easy to use, they tend to be relatively expensive. Other rail systems are known that attempt to overcome the inherent problems of bending the rail by placing a solid metal bar in the center of the flexible rail core. This metal bar is bent along with the flexible core and maintains the bend by the fact that the metal bar is now permanently deformed. The problem with this solution lies in the fact that the metal bar is situated in the center of the flexible insulating core rail. This produces a wide cross-section in the finished product because the centrally located metal bar must be effectively insulated from the current conductors which are laterally situated with respect to the bar. What is needed, is a system where the end user is able to easily bend the tracks as desired and where the tracks may thereafter be further bent as needed to fit interior spaces and lighting requirements.

A purpose of the present invention is to eliminate the above disadvantages and produce a low voltage contact rail system that provides simplicity of construction and unlimited possibilities of lamp placement, and which is easily bent on site with good finished appearance.

The following art defines the present state of this field:

Glass, U.S. Pat. No. 4,190,309 describes a lighting fixture, which is adjustably positioned along a track and which permits simplified adjustment along the track as well as facilitating installation and removal from the track. The track is an elongated housing with a T-shaped channel formed in the housing and a pair of parallel conductor strips embedded into a portion of the channel. The adjustable lighting fixture includes a contacting member, which can be inserted into the track and rotated in the channel. A pair of conical contacts are contained on the contacting member for contacting the conductor strips in the channel. A threaded post extends from the contacting member and wires extend from the contact through the post for connection to a lighting device. A cover is axially movable long the post and is axially moved along the post by means of a cap which threads onto the post. The cover includes a locking arrangement for preventing rotation of the fixture in the track once it is installed.

Wulfman et al., U.S. Pat. No. 5,154,509 describes a low voltage track lighting system wherein the track transmits current at 12 V AC to standard quartz halogen 12 volt lamps. The track may be made of interlocking components, namely; an electrical strip made of copper tubes partially embedded in a flexible plastic member, and a metal bracket for attachment to a ceiling, wall, or other support. The attachment system between the track and a given fixture uses magnetic attraction, and wherein replaceable magnets in the mount of each fixture attach to the metal bracket of the track to hold the fixture in place and provide the force for contact with the electrical strip.

Lin, U.S. Pat. No. 5,603,622 describes a track light mounting arrangement including a plurality of tracks fastened to locating frames, a plurality of electric boxes slidably coupled to the tracks to hold a respective lamp assembly, a plurality of sliding switches respectively coupled to the electric boxes and moved forward to turn on the respective lamp assemblies or backward to turn them off. Circular distribution boxes may be installed for coupling tracks radially by connecting devices, so that a plurality of track lights can be electrically connected and arranged in all directions.

Shemitz et al., U.S. Pat. No. 5,672,003 describes a universal track light mounting system for mounting luminaires or other components to track lighting tracks of different sizes. The system includes a universal track clamp having first and second brackets that mount around the outside of a track. One bracket engages the top and one side of the track while the other engages the top and one other side of the track. A clamp fastener adjustably interconnects the brackets. A third bracket may be provided to anchor the clamp fastener to one of the first and second brackets. The adjustable interconnection enables the universal track clamp to mount to tracks of different sizes. To accommodate luminaires of different sizes, the clamp has several attachment positions, which also provide a coarse adjustment of the width of the clamp. Because luminaires are mounted to the track by a clamp around the outside of the track, a separate power adapter is provided to connect the luminaire to power conductors inside the track.

Lin, U.S. Pat. No. 6,358,070 describes a track and connector arrangement for a track light in which the connecting unit at each end of the connector has two conductor holders holding positive and negative conductors at a respective metallic spring plate, and the track has two electrically conductive wire rods of rectangular cross-section that are respectively inserted into the conductor holders and held in contact with the respective metallic spring plate in each conductor holder to receive power supply from the positive and negative conductors after connection of the connector to the track.

The prior art teaches track lighting structures but does not teach a colored track that is able to be easily bent and maintained in a selected curvature by hand. The present invention fulfills these needs and provides further related advantages as described in the following summary.

SUMMARY OF THE INVENTION

The present invention teaches certain benefits in construction and use which give rise to the objectives described below.

According to the invention, a low voltage contact rail system, two flexible conductors are held electrically insulated from each other by a flexible none conducting support section or core rail extrusion. The conductors are firmly held in position by suitable adhesive or mechanically. Further, the core rail has two cavities or holes at the top and bottom, each carrying a permanently fitted stabilizing metal tube. The external form of the support section profile thus created is such that an accidental short circuit cannot occur by accidentally draping a metal conductor such as metallic tinsel over it. On bending the rail about its vertical axis the two metal tubes top and bottom permanently deform to the required radius and maintain the flexible sections of the rail in this position indefinitely. The ends of the rail can then be trimmed using conventional tools to provide a clean finish.

The present lighting track apparatus includes elongated colored tubes which are easily bent into stable curved shapes to custom shape and fit sections of the apparatus into a track lighting system. Plural elongated electrical conductors are mechanically flexible and able to support low voltage lighting currents without significant temperature rise. An elongated non-conducting mechanical support is highly flexible so as to accept the shape of the tubes when bent. It engages with the tubes and the electrical conductors, whereby, the apparatus is easily formed into a curved shape that retains a selected curvature. A lamp or other appliance can be mounted on the apparatus, electrically contacting the conductors for power. The mechanical support is transparent so that the tubes may be seen.

A primary objective of the present invention, a low voltage track for lighting, is to provide an apparatus and method of use of such apparatus that provides advantages not taught by the prior art.

Another objective is to provide such an invention capable of being easily cut to length and bent on site to fit a particular interior space.

A further objective is to provide such an invention capable of being provided in a wide range of colors.

A still further objective is to provide such an invention having low voltage rails that are at once easily available for electrical connection to an appliance, yet will not be easily short circuited by a piece of tinsel draped over it.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

The accompanying drawings illustrate the present invention. In such drawings.

DETAILED DESCRIPTION OF THE INVENTION

The above described drawing figures illustrate the invention in at least one of its preferred embodiments, which is further defined in detail in the following description.

Figure 3:
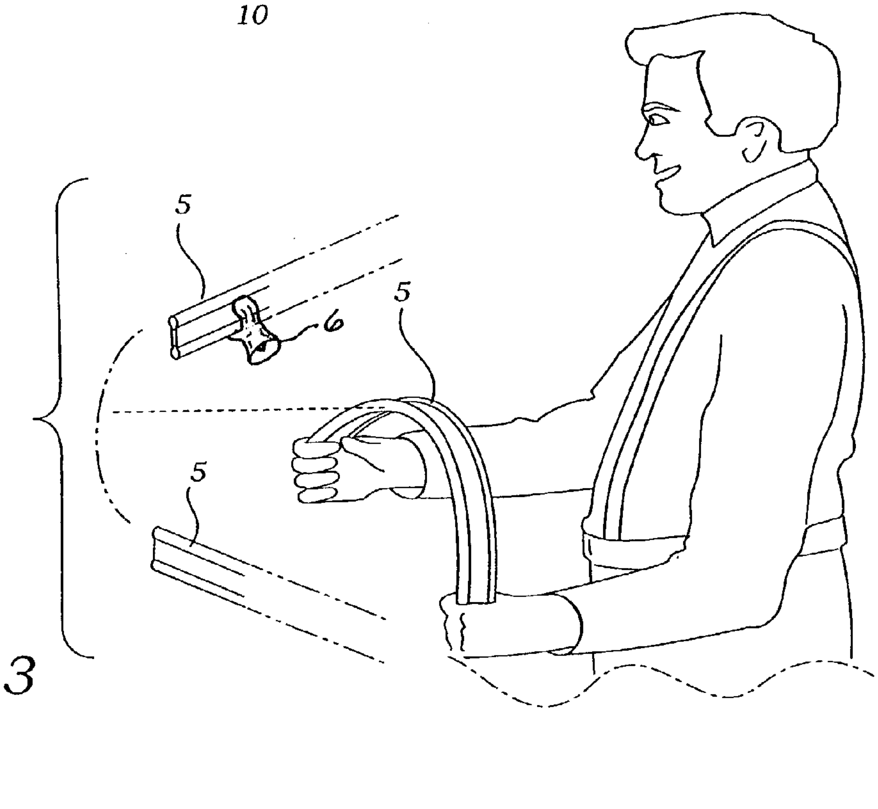
FIG. 3 is a perspective view thereof showing the bending of a section of the invention to be fitted between two linear sections thereof.

The present invention is a lighting track apparatus 5 for use in low-voltage lighting and other applications in interior spaces. FIG. 3 depicts the use of the invention wherein the apparatus 5 receives a lamp 6. The apparatus 5 is preferably made in 10 foot or 20 foot long linear pieces, and may be cut to length on site and custom bent and fitted to an interior configuration. Connection of one length of the apparatus 5 to the next is not addressed here, but one of skill in the art would have no difficulty in enabling such butt joints. Likewise, the apparatus may be easily attached to a wall, ceiling or other support by those of skill, and such joints are shown in the prior art incorporated herein by reference. The apparatus 5 includes an elongated means for shape stability 10 characterized as being easily bent into stable curved shapes, that is, once formed or bent to a desired shape, the stability means 10 tends to maintain such shape until again bent to an alternate shape at some future time. This enables fitting of the apparatus 5 to complex interior layouts to achieve a custom appearance (See FIG. 3). The apparatus 5 also provides plural elongated electrical conductors 20, preferably two such conductors, each characterized as being mechanically flexible and able to support low voltage lighting currents with a relatively low temperature rise. The preferred material for the conductors 20 is soft annealed copper which has a low electrical resistance and is easily bent to shape and maintains such shape after bending. Finally, the apparatus 5 includes an elongated means for mechanical support 30 which is characterized as being mechanically flexible and an electrical non-conductor. Plastics make an excellent choice for this element of the apparatus 5 due to their electrical insulating properties, their flexibility and their tranparency. The support means 30 engages the stability means 10 and the electrical conductors 20, whereby, the apparatus 5 is easily formed into a curved shape that retains a selected curvature after forming (bending) mainly due to the stability means 10.

Figure 1:
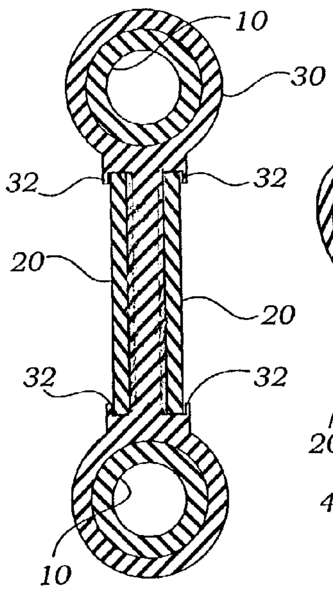
FIG. 1 is a perspective view of a preferred embodiment of the invention.
Figure 2:
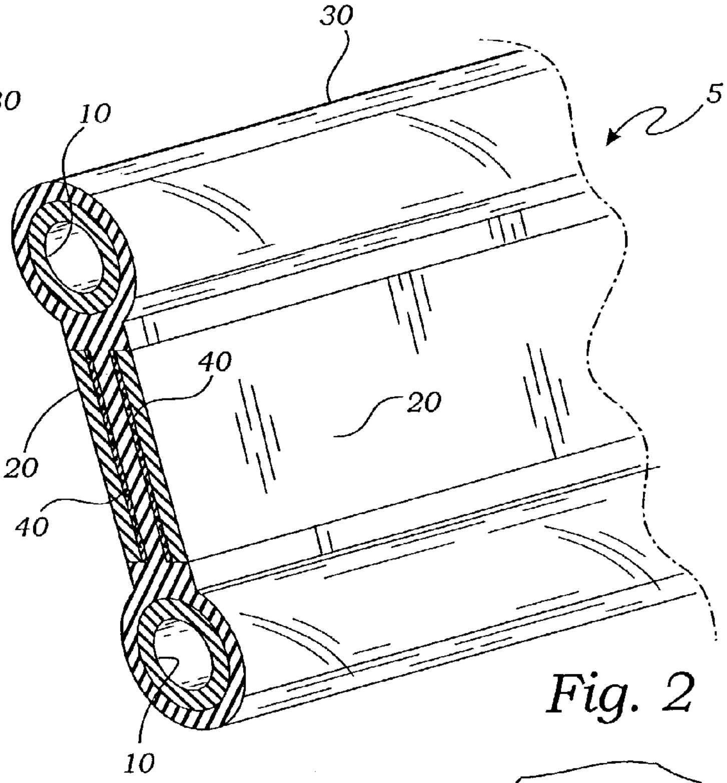
FIG. 2 is an elevational section view of a modified embodiment thereof.

As shown in FIGS. 1 and 2, the shape stability means 10 is fully enclosed within tubular elements of the support means 30, the tubular elements joined in spaced apart positions by a connecting portions. Preferably, the support means 30 is made of a flexible and transparent material, preferably from polycarbonate plastic resin, such as Lexan® from the General Electric Co. or equal. Lexan can be molded by injection processes and by extrusion as well, in a crystal clear form that is desirable in the present invention. This enables the shape stability means 10 to be advantageously viewed through the support means 30. This is of particular benefit when the shape stability means 10 is of a selected color which may harmonize with interior color schemes as in restaurants and such.

As shown in FIGS. 1 and 2, the shape stability means 10 comprises dual elements. Each of the dual elements may be a tube, as shown, or a rod and may be of similar or different sizes depending upon the aesthetic effect that one wishes to achieve. A tube may be easier to bend and have a lower weight for the same structural strength as a rod. A rod may be less expensive to apply and may be made in a smaller diameter than a tube for similar strength and ease of bending. Also, these elements may have a round or a non-round cross-sectional shape. For instance, a hexagonal cross-sectional shape may provide a more appealing look as compared with a simple round shape.

Preferably, the dual elements 10 are made of soft annealed metal, typically aluminum or steel, with a colorized chemical processed outer surface, respectively anodizing or iridizing processes. Of course other materials, shapes, sizes, coloring treatments, etc. may be used as well. However, these elements must be easily bent and must maintain their shape after bending. Soft annealed metals appear to be the best materials for this application.

The duel elements 10 are preferably positioned, respectfully, at a top and at a bottom position in the apparatus 5 as shown in FIG. 1. In this ease, bending is applied about the long axis in FIG. 1 and such is illustrated in FIG. 3. Likewise, the plural electrical conductors 20 are preferably flat strips placed on opposing sides of the connecting portion of support 30 positionally between the dual elements 10 as shown in the figures. Electrical isolation of the conductors 20 from each other is achieved by the support 30. Engagement of the electrical conductors 20 may be by double sided tape 40 or by other attachment means. Of particular benefit is to engage the conductors 20 with the support 30 by mechanical means, as shown in FIG. 1 where lips 32 capture the conductors 20 but do not restrain them from moving longitudinally relative to support 30. In this case the conductors 20 are not fixed relative to the support 30. This enables the conductors 20 to move longitudinally relative to the support 30 when the apparatus 5 is being bent, i.e., the outer conductor 20 takes a larger radius than the inner conductor 20.

While the invention has been described with reference to at least one preferred embodiment, it is to be clearly understood by those skilled in the art that the invention is not limited thereto. Rather, the scope of the invention is to be interpreted only in conjunction with the appended claims and it is made clear, here, that the inventor(s) believe that the claimed subject matter is the invention.

What is claimed is:

1. A lighting track apparatus comprising: an elongated mechanical support providing dual spaced apart tubular elements integrally joined by a connecting portion, the mechanical support formed of a flexible electrical non-conductor, a pair of elongated tubes for shape stability, each of the tubes engaged within one of the tubular elements of the mechanical support, the tubes easily bent into stable curved shapes; a pair of elongated electrical conducting flat strips engaged on opposing sides of the connecting portion of the mechanical support, the electrical conducting strips characterized as being mechanically flexible and supportive of low voltage lighting currents; exposed surfaces of the conducting strips directed in opposition, whereby, the apparatus is easily formed into a curved shape retaining a selected curvature.

2. The apparatus of claim 1 wherein the mechanical support is of a transparent material, the tubes of a selected color visible through the mechanical support.

3. The apparatus of claim 1 wherein the conducting strips are retained by opposing lips of the connecting portion of the mechanical support.

4. A lighting track apparatus comprising: an elongated mechanical support providing dual spaced apart tubular elements integrally joined by a connecting portion, the mechanical support formed of a flexible electrical non-conductor; a pair of elongated rods for shape stability, each of the rods engaged within one of the tubular elements of the mechanical support, the rods easily bent into stable curved shapes; a pair of elongated electrical conducting flat strips engaged on opposing sides of the connecting portion of the mechanical support, the electrical conducting strips characterized as being mechanically flexible and supportive of low voltage lighting currents; exposed surfaces of the conducting strips directed in opposition, whereby, the apparatus is easily formed into a curved shape retaining a selected curvature.

5. The apparatus of claim 4 wherein the mechanical support is of a transparent material; the rods of a selected color visible through the mechanical support.

6. The apparatus of claim 4 wherein the conducting strips are retained by opposing lips of the connecting portion of the mechanical support.

7. A lighting track apparatus comprising: an elongated mechanical support providing dual spaced apart tubular elements integrally joined by a connecting portion, the mechanical support formed of a flexible electrical non-conductor, an elongated rod and an elongated tube for shape stability, one of the rod and the tube engaged within one of the tubular elements of the mechanical support, the rod and tube easily bent into stable curved shapes; a pair of elongated electrical conducting flat strips engaged on opposing sides of the connecting portion of the mechanical support, the electrical conducting strips characterized as being mechanically flexible and supportive of low voltage lighting currents; exposed surfaces of the conducting strips directed in opposition, whereby, the apparatus is easily formed into a curved shape retaining a selected curvature.

8. The apparatus of claim 5 wherein the mechanical support is of a transparent material; the rod and the tube each of a selected color visible trough the mechanical support.

9. The apparatus of claim 5 wherein the conducting strips are retained by opposing lips of the connecting portion of the mechanical support.

* * * * *